(12) United States Patent
Nien

(10) Patent No.: US 11,942,950 B2
(45) Date of Patent: Mar. 26, 2024

(54) INPUT CLOCK BUFFER AND CLOCK SIGNAL BUFFEREING METHOD

(71) Applicant: Elite Semiconductor Microelectronics Technology Inc., Hsinchu (TW)

(72) Inventor: Shu-Han Nien, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 154 days.

(21) Appl. No.: 17/847,225

(22) Filed: Jun. 23, 2022

(65) Prior Publication Data
US 2023/0421143 A1  Dec. 28, 2023

(51) Int. Cl.
*H03K 5/135* (2006.01)
*H03K 5/24* (2006.01)
*H03K 5/00* (2006.01)

(52) U.S. Cl.
CPC ........... *H03K 5/135* (2013.01); *H03K 5/2418* (2013.01); *H03K 5/2427* (2013.01); *H03K 2005/00176* (2013.01)

(58) Field of Classification Search
CPC .... H03K 5/135; H03K 5/2418; H03K 5/2427; H03K 2005/00176
See application file for complete search history.

(56) References Cited

U.S. PATENT DOCUMENTS

| | | | |
|---|---|---|---|
| 8,693,557 B1* | 4/2014 | Zhang | H04L 25/0272 375/259 |
| 2005/0024107 A1* | 2/2005 | Takai | H03L 7/087 327/158 |
| 2014/0002158 A1* | 1/2014 | Shi | H03K 5/1565 327/175 |
| 2022/0052659 A1* | 2/2022 | Tsai | H03F 3/45475 |
| 2022/0077860 A1* | 3/2022 | Ding | H04L 25/0266 |
| 2022/0368321 A1* | 11/2022 | Wu | H03F 3/005 |
| 2023/0318582 A1* | 10/2023 | Hussain | H03H 11/04 |
| 2023/0370071 A1* | 11/2023 | Lin | H03L 7/083 |

\* cited by examiner

*Primary Examiner* — Seokjin Kim
(74) *Attorney, Agent, or Firm* — Winston Hsu

(57) ABSTRACT

An input clock buffer, comprising: a first capacitor; a second capacitor; a first amplifier, configured to generate a first output signal, comprising input terminals coupled to the first capacitor and the second capacitor, wherein the first capacitor and the second capacitor receives a differential input signal; a second amplifier, configured to generate a second output signal according to the differential input signal; a frequency detection circuit, configured to generate a frequency detection signal according to a frequency of the differential input signal; and a switch, located between an output of the first amplifier and an output of the second amplifier, configured to turn on and turn off according to the frequency detection signal.

16 Claims, 7 Drawing Sheets

INPUT CLOCK BUFFER AND CLOCK SIGNAL BUFFEREING METHOD

BACKGROUND OF THE INVENTION

1. Field of the Invention

The present invention relates to an input clock buffer and a clock signal buffering method, and particularly relates to an input clock buffer and a clock signal buffering method which can compensate a DC level of a differential input signal.

2. Description of the Prior Art

A conventional input clock buffer is configured to provide an output clock signal with a desired duty ratio However, if one of the input terminals of the input clock buffer is coupled to a predetermined voltage level such as a ground level, or a DC level of the input signal received by the input terminal has non desired variation, the duty ratio of the output clock signal may become inaccurate.

SUMMARY OF THE INVENTION

Therefore, one objective of the present invention is to provide an input clock buffer which can generates an output clock signal with an accurate duty ratio.

Another objective of the present invention is to provide a clock signal buffering method which can generates an output clock signal with an accurate duty ratio.

One embodiment of the present invention discloses: an input clock buffer, comprising: a first capacitor; a second capacitor; a first amplifier, configured to generate a first output signal, comprising a first input terminal coupled to the first capacitor and comprising a second input terminal coupled to the second capacitor, wherein the first capacitor and the second capacitor receives a differential input signal and form a first pair of signal paths for the differential input signal; a second amplifier, configured to generate a second output signal, comprising a first input terminal and a second input terminal, wherein the first input terminal of the second amplifier and the second input terminal of the second amplifier form a second pair of signal paths for the differential input signal; a frequency detection circuit, configured to generate a frequency detection signal according to a frequency of the differential input signal; and a switch, located between an output of the first amplifier and an output of the second amplifier, configured to turn on and turn off according to the frequency detection signal.

Another embodiment of the present invention discloses: a clock signal buffering method, comprising: (a) filtering a DC component of a differential input signal; (b) forming a first pair of signal paths for the differential input signal by input terminals of a first amplifier after filtering the DC component; (c) generating a first output signal by the first amplifier; (d) forming a second pair of signal paths for the differential input signal by input terminals of a second amplifier; (e) generating a second output signal by the second amplifier; (f) generating a frequency detection signal according to a frequency of the differential input signal; and (g) selectively coupling an output of the first amplifier and an output of the second amplifier according to the frequency detection signal.

In view of above-mentioned embodiments, the duty ratio of the output clock signal can keep accurate even if the DC level of the differential input signal varies.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Also, the method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices.

Figure 1:
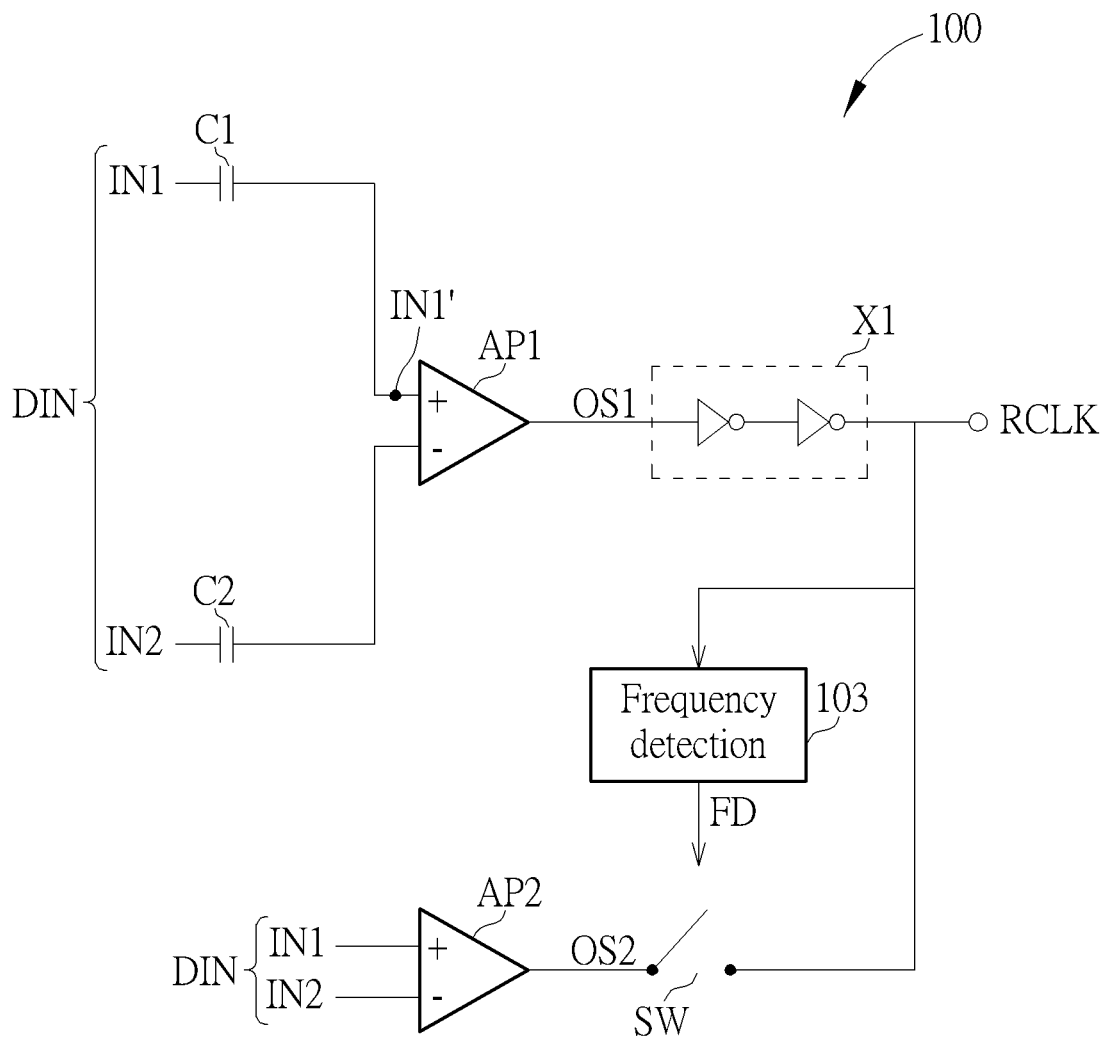
FIG. 1 is a block diagram illustrating an input clock buffer according to one embodiment of the present invention.

FIG. 1 is a block diagram illustrating an input clock buffer according to one embodiment of the present invention. As illustrated in FIG. 1, the input clock buffer 100 comprises a first capacitor C1, a second capacitor C2, a first amplifier AP1, a second amplifier AP2, a frequency detection circuit 103, and a switch SW. The first amplifier AP1 is configured to generate a first output signal OS1, comprises a first input terminal coupled to the first capacitor C1 and comprises a second input terminal coupled to the second capacitor C2. The first capacitor C1 and the second capacitor C2 receive a differential input signal DIN and form a first pair of signal paths for the differential input signal DIN. As illustrated in FIG. 1, the differential input signal DIN is formed by a first input signal IN1 and a second input signal IN2.

The second amplifier AP2 is configured to generate a second output signal OS2, and also comprises a first input terminal and a second input terminal. The first input terminal of the second amplifier AP2 and the second input terminal of the second amplifier AP2 form a second pair of signal paths for the differential input signal DIN. The frequency detection circuit 103 is configured to generate a frequency detection signal FD according to a frequency of the differential input signal DIN. The switch SW is located between an output of the first amplifier AP1 and an output of the second amplifier AP2, configured to turn on (conducted) and turn off (non-conducted) according to the frequency detection signal FD. Details of the frequency detection will be described later.

In the embodiment illustrated in FIG. 1, the frequency detection circuit 103 generates the frequency detection signal FD according to the reference clock signal RCLK. The frequency of the reference clock signal RCLK corresponds to a frequency of the first output signal OS1, and the frequency of the first output signal OS1 corresponds to a frequency of the differential input signal DIN. Therefore, the frequency detection circuit 103 can generate the frequency detection signal FD according to the frequency of the differential input signal DIN by generating the frequency detection signal FD according to the reference clock signal RCLK. However, please note the frequency detection circuit 103 can generate the frequency detection signal FD according to the frequency of the differential input signal DIN via any other mechanism rather than the mechanism illustrated in FIG. 1.

In one embodiment, the switch SW turns on if the frequency of the first output signal OS1 is lower than a frequency threshold and turns off if the frequency of the first output signal OS1 is higher than the frequency threshold. In other words, the switch SW turns on if the frequency of the first output signal OS1 has a low frequency and turns off if the frequency of the first output signal OS1 has a high frequency. By this way, since the first output signal OS1 and the second output signal OS2 are combined to generate the reference clock signal RCLK, the second output signal OS2 can be combined to the reference clock signal RCLK if the switch SW turns on when the first output signal OS1 has a low frequency. Thereby the non-ideal factors, such as current leakages, of the input terminal of the first amplifier AP1 can be improved.

Figure 2:
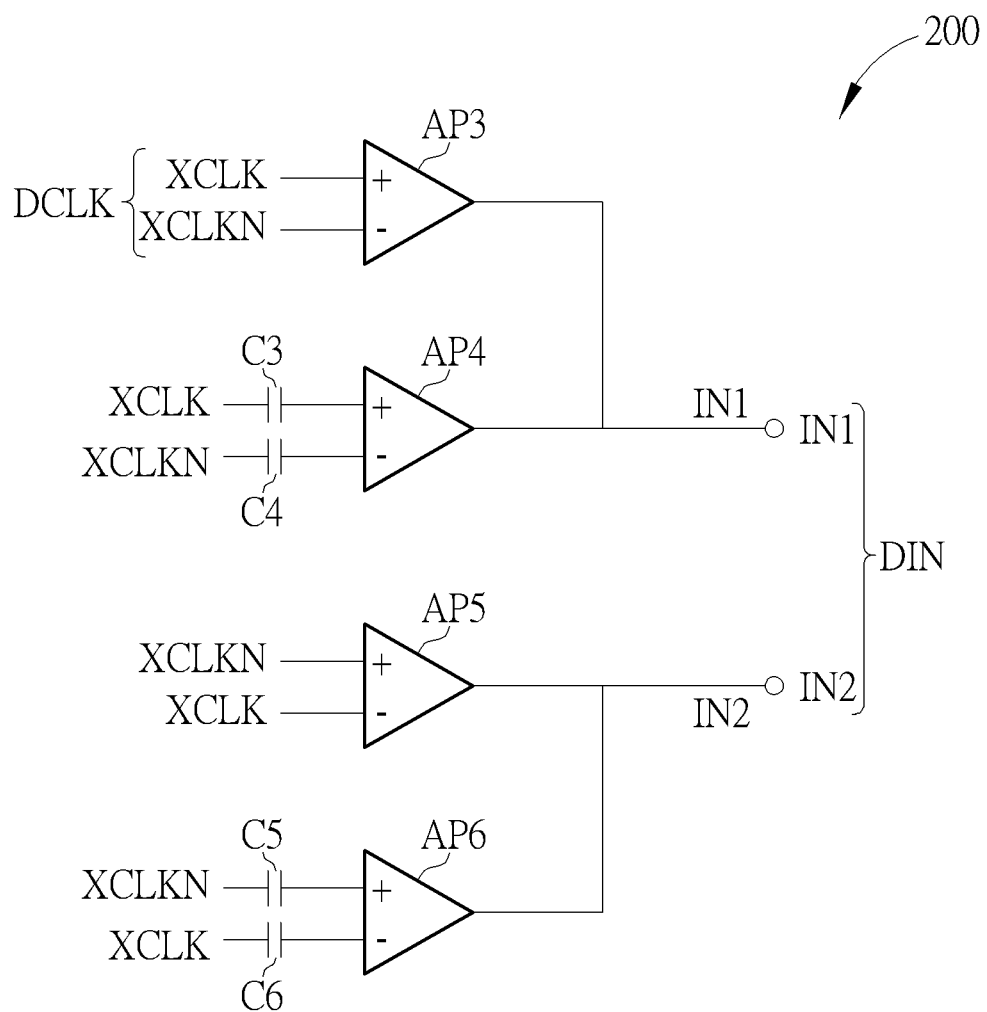
FIG. 2 is a circuit diagram illustrating circuits for providing the differential input signal illustrated in FIG. 1, according to one embodiment of the present invention.

In one embodiment, the first input signal IN1 is a clock signal and the second input signal IN2 is an inverted signal of the first input signal IN1. However, the first input signal IN1 and the second input signal IN2 can be other kinds of signals. FIG. 2 is a circuit diagram illustrating circuits for providing the differential input signal DIN illustrated in FIG. 1, according to one embodiment of the present invention. In the embodiment of FIG. 2, a circuit 200 for providing the differential input signal DIN comprises a third capacitor C3, a four capacitor C4, a third amplifier AP3 and a fourth amplifier AP4. The third amplifier AP3 comprises a first input terminal and a second input terminal, wherein the first input terminal of the third amplifier AP3 and the second input terminal of the third amplifier AP3 form a third pair of signal paths for a differential clock signal DCLK. The differential clock signal DCLK is formed by a clock signal XCLK and a clock signal XCLKN which is an inverted signal of the clock signal XCLK.

The fourth amplifier AP4 comprises a first input terminal and a second input terminal, wherein the first input terminal of the fourth amplifier AP4 and the second input terminal of the fourth amplifier AP4 form a fourth pair of signal paths for the differential clock signal DCLK. The differential input signal DIN is generated according to outputs of the third amplifier AP3 and an output of the fourth amplifier AP4. Specifically, the first input signal IN1 which can be used to generate the differential input signal DIN is generated according to outputs of the third amplifier AP3 and the fourth amplifier AP4.

In one embodiment, if the clock signal XCLK and the clock signal XCLKN receive by the third amplifier AP3 both have variations (i.e., have rising edges and falling edges), the first input signal IN1 is generated according to the output of the third amplifier AP3 and the output of the fourth amplifier AP4. However, if one of the clock signal XCLK and the clock signal XCLKN does not vary (i.e., does not have rising/falling edges), for example, the clock signal XCLK is a predetermined voltage level such as a ground level, the output of the third amplifier AP3 does not respond the difference between the clock signal XCLK and the clock signal XCLKN but the output of the fourth amplifier AP4 still responds the difference between the clock signal XCLK and the clock signal XCLKN due to the capacitors C3, C4. In such case, since the outputs of the third amplifier AP3 and the fourth amplifier AP4 are connected together, the output of the third amplifier AP3 affects the value of the first input signal IN1. By this way, the duty ratio of the first input signal IN1 is different from the duty ratio of the clock signal XCLKN.

In the embodiment of FIG. 2, the circuit 200 comprises a fifth capacitor C5, a sixth capacitor C6, a fifth amplifier AP5 and a sixth amplifier AP6, but not limited. The fifth capacitor C5, the sixth capacitor C6, the fifth amplifier AP5 and the sixth amplifier AP6 can be configured to generate the second input signal IN2, and have arrangements and operations the same as the circuit for generating the first input signal IN1. Accordingly, repeated descriptions are omitted for brevity here.

In one embodiment, the input signals for generating the differential input signal DIN can be generated by only one kind of amplifier. For example, the first input signal IN1 or the second input signal IN2 can be generated only according to an amplifier having the structure of the third amplifier AP3. For another example, the first input signal IN1 or the second input signal IN2 can be generated only according to an amplifier having the structure of the fourth amplifier AP4. Such variation should also fall in the scope of the present invention.

Figure 3:
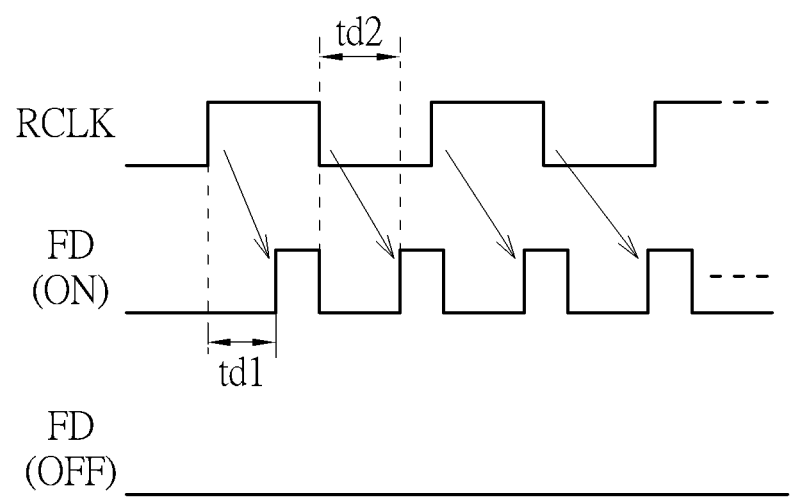
FIG. 3 is a schematic diagram illustrating how to generate the frequency detection signal illustrated in FIG. 1, according to one embodiment of the present invention.

The frequency detection circuit 103 illustrated in FIG. 1 can be implemented by various circuits. Please refer to FIG. 1 again, in one embodiment, the input clock buffer 100 further comprises a delay circuit Xl, configured to generate a delay signal of the first output signal OS1. If the switch SW turns off, the delay signal is the reference clock signal RCLK, and if the switch SW turns on, the reference clock signal RCLK is a combination of the first output signal OS1 and the second output signal OS2. The frequency detection circuit 103 generates the frequency detection signal FD according to edges of the delay signal FIG. 3 is a schematic diagram illustrating how to generate the frequency detection signal FD illustrated in FIG. 1, according to one embodiment of the present invention. In such case, the frequency detection circuit 103 can comprise a plurality of logic gates (such as NAND gates and NOR gates) and a plurality of inverters to perform the operations illustrated in FIG. 3. As shown in FIG. 3, the switch SW turns on when the frequency detection signal FD has a high logic level, and turns off when the frequency detection signal FD has a low logic level. Also, the rising edges of the frequency detection signal FD correspond to a delay phase of the rising/falling edges of the reference clock signal RCLK. In one embodiment, a time difference td1 exists between a rising edge of the frequency detection signal FD and a rising edge of the reference clock signal RCLK. Also, time difference td2 exists between a next rising edge of the frequency detection signal FD and a falling edge of the reference clock signal RCLK.

Therefore, the time interval of the high logic level of the frequency detection signal FD can be set via setting time differences td1 and td2 in the embodiment of FIG. 3. Also, the frequency threshold can be set via setting the time differences td1 and td2 in the embodiment of FIG. 3. If the frequency of the reference clock signal RCLK is larger than the frequency threshold, the signal period of the reference clock signal RCLK decreases, thus a time interval that the frequency detection signal FD has a high logic level also decreases. If the time interval of the high logic level of the frequency detection signal FD is smaller than td1, the frequency detection signal FD keeps at a low logic, thus the switch SW in FIG. 2 keeps turning off. In other words, if the time difference td1 is a constant value and a frequency of the reference clock signal RCLK is larger than the frequency threshold, the switch SW in FIG. 1 keeps turns off. The frequency threshold can be set corresponding to different circuit requirements. In one embodiment, the frequency threshold is 200 MHz.

Figure 4:
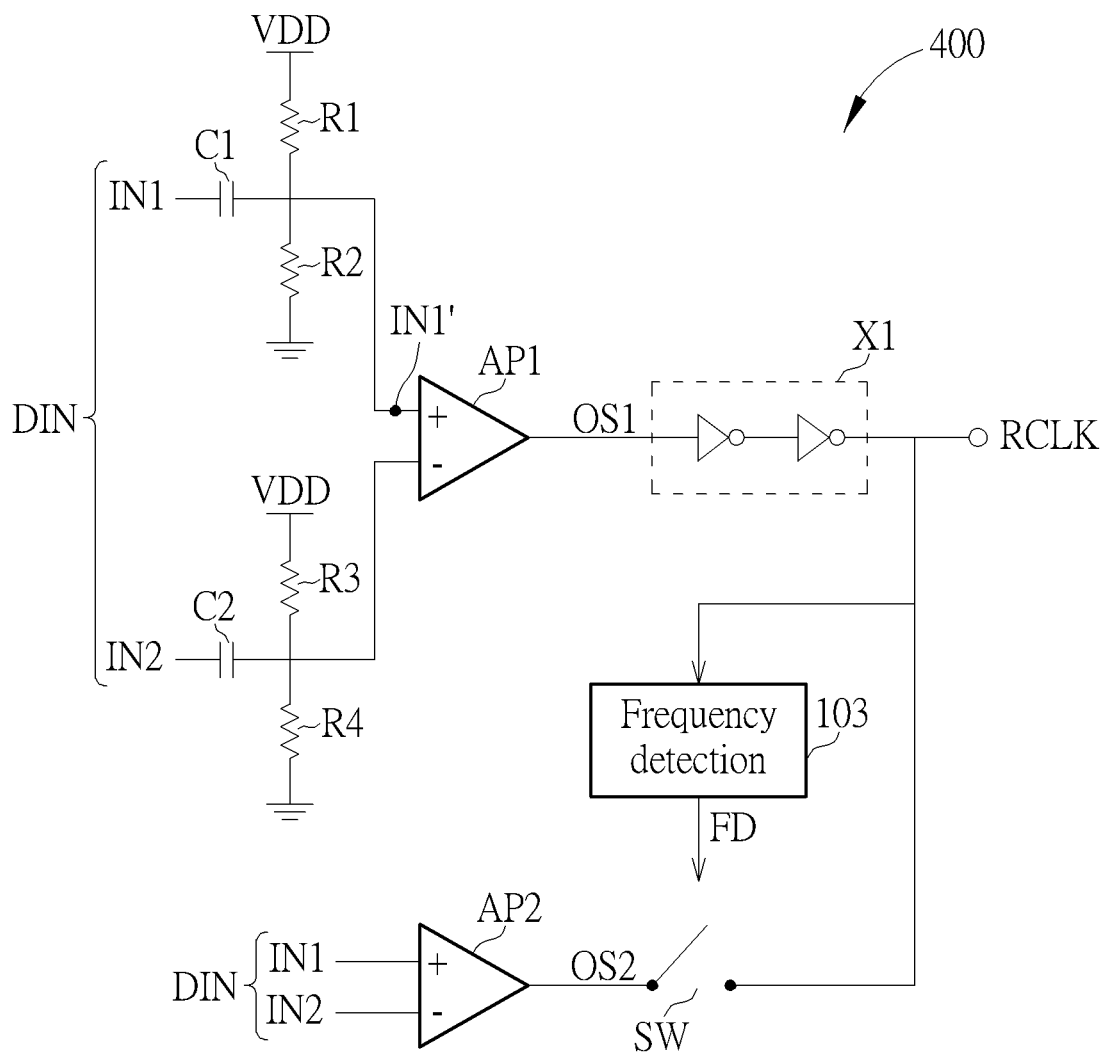
FIG. 4 is a block diagram illustrating an input clock buffer according to another embodiment of the present invention.

FIG. 4 is a block diagram illustrating an input clock buffer 400 according to another embodiment of the present invention. Besides the components illustrated in FIG. 1, the input clock buffer 400 further comprises a DC level providing circuit, which is coupled to the first capacitor C1, the second capacitor C2, the first input terminal of the first amplifier and the second input terminal of the first amplifier AP1. The DC level providing circuit is configured to provide a DC level to the differential input signal DIN after the DC component thereof is filtered. In the embodiment of FIG. 4, the DC level providing circuit comprises resistors R1, R2, R3, R4, which form a voltage divider. Also, in one embodiment, the resistors R1, R2, R3, R4 provide a DC voltage level of VDD/2.

Figure 5:
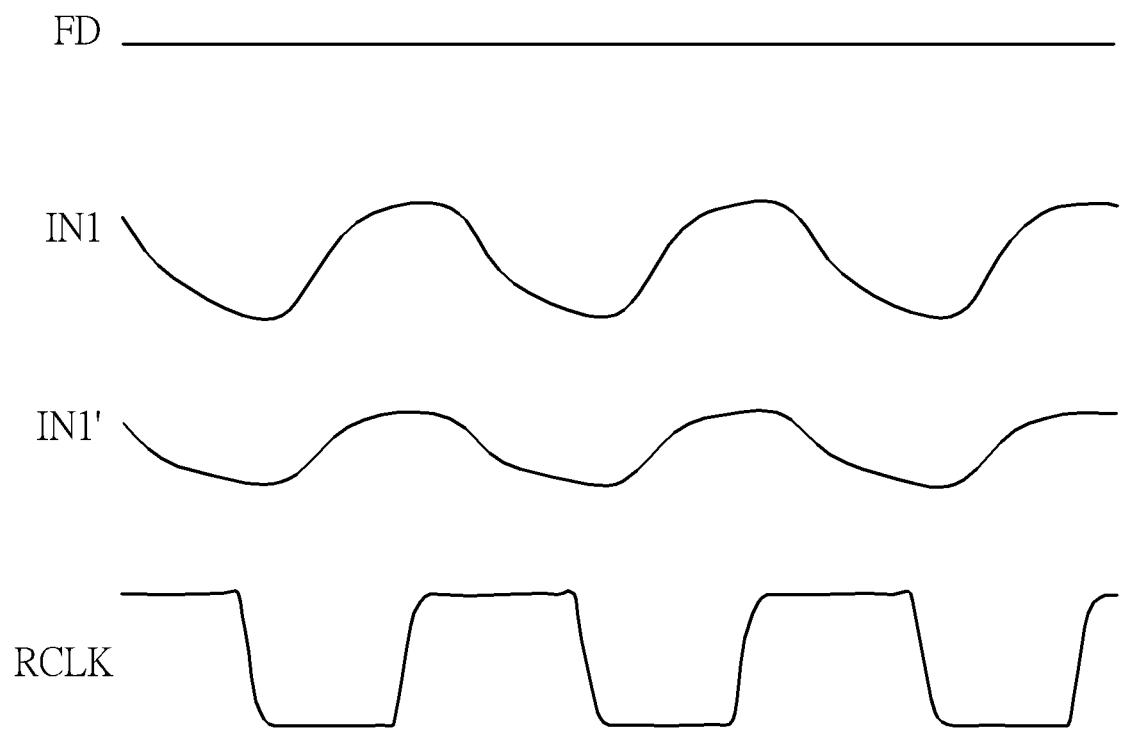
FIG. 5 is a schematic diagram illustrating operations of the input clock buffer in FIG. 4 when the switch turns off, according to one embodiment of the present invention.

FIG. 5 is a schematic diagram illustrating operations of the input clock buffer in FIG. 4 when the switch turns off, according to one embodiment of the present invention. That is, in the embodiment of FIG. 5, a frequency of the differential input signal DIN is higher than the frequency threshold. Please note, in order to simplify the drawing, only the first input signal IN1 is illustrated, and the second input signal IN2 which is an inverted signal of the first input signal IN1 is not illustrated. Also, the signal IN1' which is received by the first terminal of the first amplifier AP1 means the DC component of the first input signal IN1 is filtered by the first capacitor C1 and then re-provided by the DC level providing circuit.

As shown in FIG. 5, the frequency detection signal FD keeps at a low logic level, thus the switch SW turns off. Therefore, the output of the second amplifier AP2 is not coupled to the output of the first amplifier AP1, and the output clock signal of the input clock buffer 400 is only affected by the output of the first amplifier AP1. Thus, the duty ratio of the output clock signal RCLK (the reference clock signal) can approach the desired value as the duty ratio of IN1.

Figure 6:
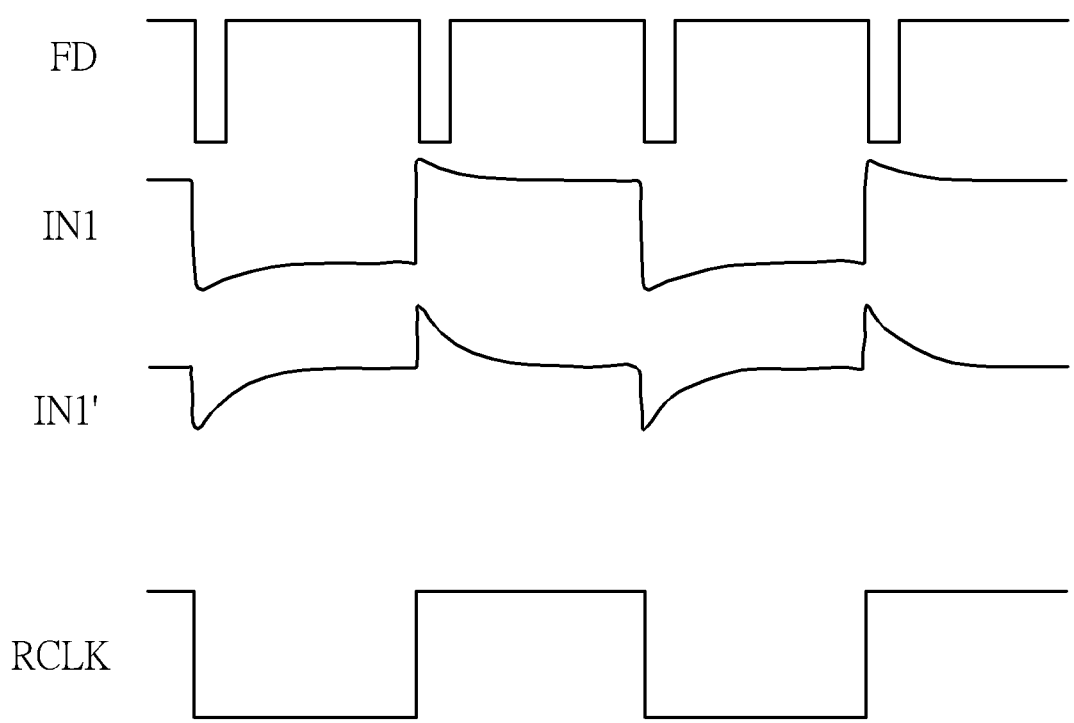
FIG. 6 is a schematic diagram illustrating operations of the input clock buffer in FIG. 4 when the switch turns on, according to one embodiment of the present invention.

FIG. 6 is a schematic diagram illustrating operations of the input clock buffer in FIG. 4 when the switch turns on, according to one embodiment of the present invention. That is, in the embodiment of FIG. 6, a frequency of the differential input signal DIN is lower than the frequency threshold. Please note, in order to simplify the drawing, only the first input signal IN1 is illustrated, and the second input signal IN2 which is an inverted signal of the first input signal IN1 is not illustrated. Also, the signal IN1' which is received by the first terminal of the first amplifier AP1 means the DC component of the first input signal IN1 is filtered by the first capacitor C1 and then re-provided by the DC level providing circuit.

In the embodiment of FIG. 6, since the frequency of the differential input signal DIN is low, some leakage currents may flow to the ground through the DC level providing circuit. Therefore, the DC level of the first input signal IN1 decreases, and the DC level of the signal IN1' correspondingly decreases. In such case, the switch SW turns on corresponding to the high logic level of the frequency detection signal FD. By this way, the DC level of the signal IN1' can be compensated since the output of the first amplifier AP1 is coupled to the output of the second amplifier AP2.

Figure 7:
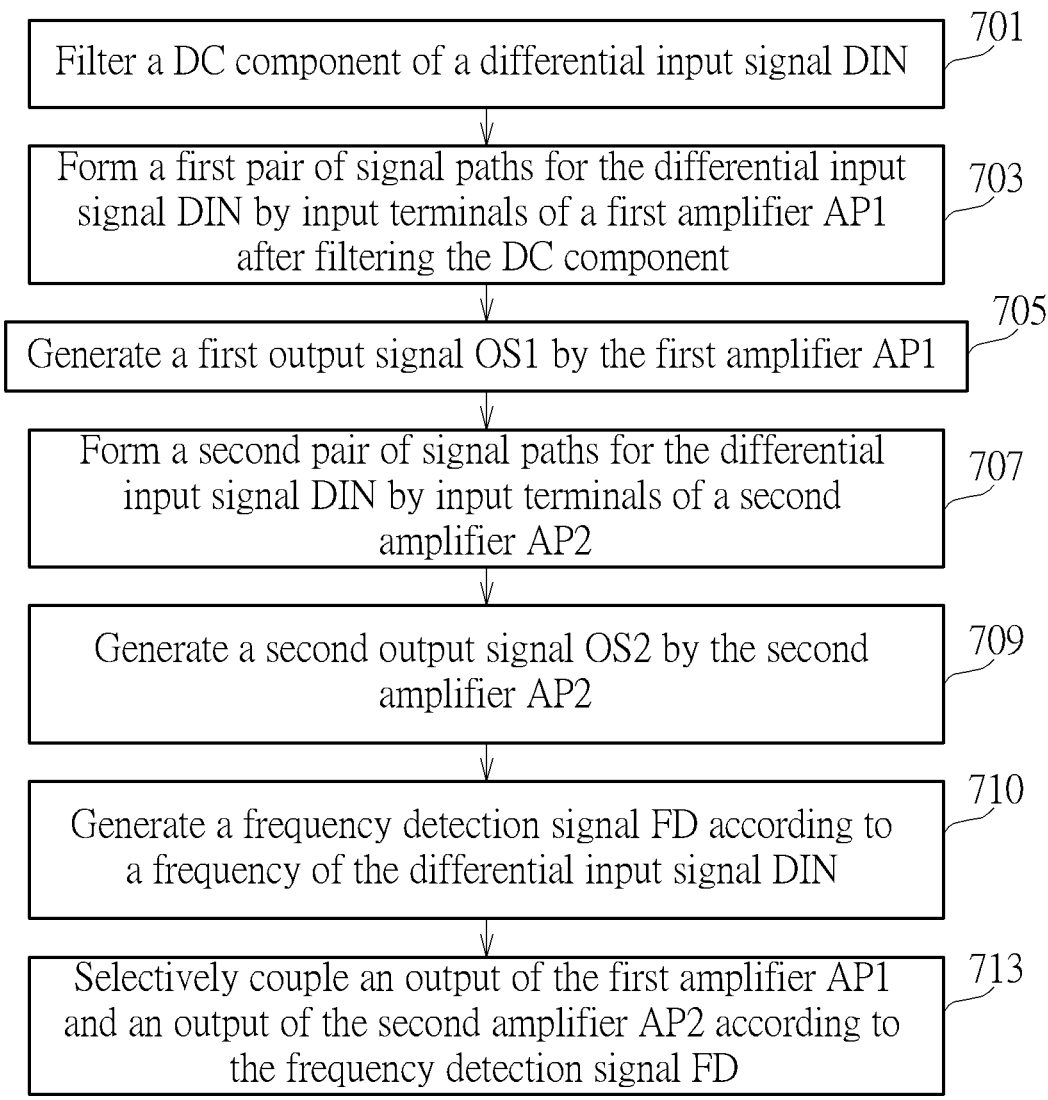
FIG. 7 is a flow chart illustrating a clock signal buffering method according to one embodiment of the present invention.

FIG. 7 is a flow chart illustrating a clock signal buffering method according to one embodiment of the present invention, which comprises following steps:

Step 701

Filter a DC component of a differential input signal DIN.

Step 703

Form a first pair of signal paths for the differential input signal DIN by input terminals of a first amplifier AP1 after filtering the DC component.

Step 705

Generate a first output signal OS1 by the first amplifier AP1.

Step 707

Form a second pair of signal paths for the differential input signal DIN by input terminals of a second amplifier AP2.

Step 709

Generate a second output signal OS2 by the second amplifier AP2.

Step 711

Generate a frequency detection signal FD according to a frequency of the differential input signal DIN.

Step 713

Selectively couple an output of the first amplifier AP1 and an output of the second amplifier AP2 according to the frequency detection signal FD.

Other detail steps can be acquired based on above-mentioned embodiments, thus are omitted for brevity here. Please note, the clock signal buffering method is not limited to be performed by the input clock buffer shown in FIG. 1 and FIG. 4.

In view of above-mentioned embodiments, the duty ratio of the output clock signal can keep accurate even if the DC level of the differential input signal varies.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input clock buffer, comprising:
a first capacitor;
a second capacitor;
a first amplifier, configured to generate a first output signal, comprising a first input terminal coupled to the first capacitor and comprising a second input terminal coupled to the second capacitor, wherein the first capacitor and the second capacitor receives a differential input signal and form a first pair of signal paths for the differential input signal;
a second amplifier, configured to generate a second output signal, comprising a first input terminal and a second input terminal, wherein the first input terminal of the second amplifier and the second input terminal of the second amplifier form a second pair of signal paths for the differential input signal;

a frequency detection circuit, configured to generate a frequency detection signal according to a frequency of the differential input signal; and a switch, located between an output of the first amplifier and an output of the second amplifier, configured to turn on and turn off according to the frequency detection signal.

2. The input clock buffer of claim 1, further comprising:
a DC level providing circuit, coupled to the first capacitor, the second capacitor, the first input terminal of the first amplifier and the second input terminal of the first amplifier, configured to provide a DC level to the differential input signal.

3. The input clock buffer of claim 1, further comprising:
a third amplifier, comprising a first input terminal and a second input terminal, wherein the first input terminal of the third amplifier and the second input terminal of the third amplifier form a third pair of signal paths for a differential clock signal;
wherein the differential input signal is generated according to an output of the third amplifier.

4. The input clock buffer of claim 1, further comprising:
a third capacitor;
a four capacitor;
a fourth amplifier, comprising a first input terminal and a second input terminal, wherein the first input terminal of the fourth amplifier and the second input terminal of the fourth amplifier form a fourth pair of signal paths for a differential clock signal;
wherein the differential input signal is generated according to an output of the fourth amplifier.

5. The input buffer of claim 1, further comprising:
a third amplifier, comprising a first input terminal and a second input terminal, wherein the first input terminal of the third amplifier and the second input terminal of the third amplifier form a third pair of signal paths for a differential clock signal;
a third capacitor;
a four capacitor;
a fourth amplifier, comprising a first input terminal and a second input terminal, wherein the first input terminal of the fourth amplifier and the second input terminal of the fourth amplifier form a fourth pair of signal paths for a differential clock signal;
wherein the differential input signal is selectively generated according to an output of the third amplifier or a fourth amplifier.

6. The input clock buffer of claim 1, further comprising:
a delay circuit, configured to generate a delay signal of the first input signal;
wherein the frequency detection circuit generates the frequency detection signal according to edges of the delay signal.

7. The input clock buffer of claim 1, wherein the switch turns on if the frequency of the differential input signal is lower than a frequency threshold and turns off if the frequency of the differential input signal is higher than the frequency threshold.

8. The input clock buffer of claim 7, wherein a DC level of the second output signal compensates a DC level of the first output signal when the switch turns on.

9. A clock signal buffering method, comprising:
(a) filtering a DC component of a differential input signal;
(b) forming a first pair of signal paths for the differential input signal by input terminals of a first amplifier after filtering the DC component;
(c) generating a first output signal by the first amplifier;

(d) forming a second pair of signal paths for the differential input signal by input terminals of a second amplifier;
(e) generating a second output signal by the second amplifier;
(f) generating a frequency detection signal according to a frequency of the differential input signal; and
(g) selectively coupling an output of the first amplifier and an output of the second amplifier according to the frequency detection signal.

10. The clock signal buffering method of claim 9, further comprising:
providing a DC level to the differential input signal after filtering the DC component of the differential input signal.

11. The clock signal buffering method of claim 9, further comprising:
forming a third pair of signal paths for a differential clock signal by input terminals of a third amplifier; and
generating the differential input signal according to an output of the third amplifier.

12. The clock signal buffering method of claim 9, further comprising:
filtering a DC component of a differential clock signal;
forming a fourth pair of signal paths for the differential input signal by input terminals of a fourth amplifier after filtering the DC component of the differential clock signal; and
generating the differential input signal according to an output of the fourth amplifier.

13. The clock signal buffering method of claim 9, further comprising:
forming a third pair of signal paths for a differential clock signal by input terminals of a third amplifier;
filtering a DC component of the differential clock signal;
forming a fourth pair of signal paths for the differential input signal by input terminals of a fourth amplifier after filtering the DC component of the differential clock signal;
selectively generating the differential input signal according to an output of the third amplifier or a fourth amplifier.

14. The clock signal buffering method of claim 9, further comprising:
generating a delay signal of the first input signal; and
generating the frequency detection signal according to edges of the first delay signal.

15. The clock signal buffering method of claim 9,
wherein the steps (g) couples the output of the first amplifier and the output of the second amplifier if the frequency of the differential input signal is lower than a frequency threshold;
wherein the steps (g) does not couple the output of the first amplifier with the output of the second amplifier if the frequency of the differential input signal is higher than the frequency threshold.

16. The clock signal buffering method of claim 15, further comprising:
compensating a DC level of the first output signal by a DC level of the second output signal when the steps (e) couples the output of the first amplifier and the output of the second amplifier.

* * * * *